United States Patent [19]

Chollet

[11] Patent Number: 5,157,324

[45] Date of Patent: Oct. 20, 1992

[54] IMPROVED ELECTRO-OPTICAL CRYSTAL

[75] Inventor: Pierre-Alain Chollet, Clamart, France

[73] Assignee: Commissariat a l'Energie Atomique, France

[21] Appl. No.: 632,361

[22] Filed: Dec. 21, 1990

[30] Foreign Application Priority Data

Dec. 26, 1989 [FR] France ............................ 89 17179
Apr. 12, 1990 [FR] France ............................ 90 04731

[51] Int. Cl.$^5$ ...................... G01R 31/00; G01R 29/00
[52] U.S. Cl. .............................. 324/96; 324/158 R; 359/251; 356/368
[58] Field of Search ............... 324/96, 158 R, 158 D, 324/73.1; 350/389, 387, 386; 250/231.1, 227.14; 359/295, 251, 257, 321, 322; 356/400, 368, 364

[56] References Cited

U.S. PATENT DOCUMENTS

| | | | |
|---|---|---|---|
| 2,788,710 | 4/1957 | West .................................. | 359/251 |
| 3,575,487 | 4/1971 | Ohm et al. ........................ | 359/251 |
| 4,510,441 | 4/1985 | Yasuda et al. ..................... | 324/96 |
| 4,595,876 | 6/1986 | Kuhara et al. ..................... | 324/96 |
| 4,631,402 | 12/1986 | Nagatsuma et al. ............. | 250/231 R |
| 4,668,052 | 5/1987 | Shirasaki ........................... | 359/251 |
| 4,929,830 | 5/1990 | Bohnert et al. ................... | 324/96 |
| 4,999,570 | 3/1991 | Ehrler ................................ | 324/96 |

FOREIGN PATENT DOCUMENTS

| | | |
|---|---|---|
| 2595820 | 3/1986 | France . |
| 58-113764 | 7/1983 | Japan . |
| 59-27266 | 2/1984 | Japan . |
| 3729382 | 3/1989 | Netherlands . |
| 2217443 | 10/1989 | United Kingdom . |

OTHER PUBLICATIONS

Proceedings of the First International Conference on Optical Fibre Sensors, Apr. 26-28, 1983, pp. 164-168, "A Fibre Optic Electric Field Sensor Using the Electroopic Effect of $Bi_4Ge_3O_{12}$", Shibata.
Review of Scientific Instruments, vol. 60, No. 7, Part 1, Jul. 1989, pp. 1252-1257, "Simultaneous Measurement of Two Orthogonal Components of Electric Field Using a Pockels Device," Hidaka et al.
SPIE, vol. 720, 1986, pp. 85-90, "Fiber Optic Field Sensor Configurations for High Bandwidth Lightning Research Measurement Applications" Nelson et al.
SPIE, vol. 720, 1986, pp. 100-104, "Photonic Electric--field Probe for Frequencies up to 2 GHz", Masterson.
Fast Electrical and Optical Measurements, vol. 1, 1986, pp. 57-71, "An Electro-Optical Technique for Measuring High Frequency Free Space Electric Fields", Chang et al.
An Introduction to Electrooptic Devices, Academic Press, pp. 44-51, 1974, Kaminow.

*Primary Examiner*—Vinh Nguyen
*Attorney, Agent, or Firm*—Hayes, Soloway, Hennessey & Hage

[57] ABSTRACT

A Pockels effect electric field sensor includes, as a sensitive element, a crystal with electro-optic properties traversed by a luminous beam with specific polarization and propagation directions. The crystal is cut into the shape of an ellipsoid (14) and has a crystallographic symmetry being either uniaxial 622, 422 or $\overline{4}$2m or cubic $\overline{4}$3m or 23, the three perpendicular axes of the ellipsoid being orientated along three trirectangular crystallographic axes with the highest symmetry of the crystal. The sensor includes at least one measuring channel which includes a monochromatic light source (2) emitting an incident beam (4), a polarizing device (6) for polarizing the incident beam along a first crystallographic direction of the crystal, inlet fiber and lens (8, 12) for introducing the polarized incident beam into the crystal along a second crystallographic direction, an analyzing device (30) for analyzing the luminous beam emerging from the crystal, and a detection device (32) for detecting the analyzed luminous signal.

19 Claims, 3 Drawing Sheets

IMPROVED ELECTRO-OPTICAL CRYSTAL

FIELD OF THE INVENTION

The present invention concerns a Pockels effect electric field sensor comprising, as a sensitive element, a crystalline body possessing electro-optic properties traversed by an incident luminous beam with specific directions of polarization and propagation. It makes it possible to, not only measure the value of an electric field, but also measure its direction.

BACKGROUND OF THE INVENTION

In most non-centrosymmetrical crystalline bodies, the refraction indices, which generally depend on the propagation and polarization direction of the incident beam, vary linearly with an electric field applied externally. This is what is known as the Pockels effect, recognized since the end of the last century. This index variation may be advantageously used to change the phase of the luminous beam, the latter then being able to be measured by an interferometric system, this being the case in electro-optic modulators.

From this phase variation, in principle, it is possible to revert to the value of the electric field. By using a non-conducting crystal and without having any metallic piece in the sensor, it is thus possible to measure the electric field without disturbing it. Moreover, such a system has the advantage of being able to be embodied with a low-powered, and consequently less expensive, light source.

Unfortunately, the phenomena are rendered complicated by virtue of the tensorial nature of the Pockels effect. In addition, the tensor of the Pockels effect generally includes 18 positive rij coefficients (with $1 \leq i \leq 6$ and $1 \leq j \leq 3$) and the same phase variation may be obtained for several electric field orientations and values.

Electric field sensors using the Pockels effect in crystals with weak symmetry have already been embodied and are described in a publication by J. Chang and C. N. Vittitoe and entitled "An electro-optical technique for measuring high frequency free space electric fields", Fast Electrical and Optical Measurements vol. 1, Current and Voltage Measurements, Martinus Nijhoff publishers, Dordrecht 1986, published by J. E. Thompson and L. H. Luessen, pp. 57–71, and in a publication by K. D. Masterson and entitled "Photonic electric field probe for frequencies up to 2 GHz", SPIE Proceedings, vol. 720 (1986), pp. 100–104.

These sensors have the drawback of only making it possible to determine the value of electric fields for which the direction is firstly known.

However, this drawback does not appear in strong symmetry crystals for which a large number of coefficients of the Pockels tensor are identically nil. In particular, in the case of cubic crystals, there are no more than three coefficients, which are all equal. In this case of symmetry, I. P. Kaminow showed in 1974 in "An Introduction to Electrooptic Devices", Academic Press, New York, pp. 40–41, which propagation and polarization directions could be used to independently measure the electric field in three perpendicular directions.

Sensors based on this method for measuring the electric field via the Pockels effect in cubic crystals has been described in the document by B. N. Nelson and al and entitled "Fiber optic electric field sensor configurations for high bandwidth lightning research measurement applications" SPIE, vol. 720 (1986), pp. 85–90.

These sensors use optical fibers to guide the incident beam entering the crystal and to guide the beam emerging from this crystal. The polarization of the incident beam is embodied by polarizers placed immediately in front of the crystal and the beam leaving the crystal is effected with an analyzer placed immediately behind the crystal. These polarizers and analyzers are situated in the measuring probe, which has the drawback of increasing the dimensions of the latter and thus prevents the electric field from being measured in the required locations. Furthermore, the crystal functions on transmission, which prohibits the carrying out of measurements of the electric field close to a wall.

In addition, and this is more serious, no care has been taken as regards the macroscopic geometric symmetry of the probe crystal. Now, the electro-optic crystals used have a dielectric constant or more than 10 (16 in the case of bismuth germanate $BI_4 Ge_3 O_{12}$). Also, such a crystal with any shape may induce distortions in the electric field lines, which ensures that such sensors provide a good order of magnitude of the measured electric field, but also mean that the real value and the direction of this field supplied by these sensors are in no way guaranteed. Accordingly, these sensors are not reliable.

Furthermore, the probe crystals used are cut into the shape of cubes and thus present an extremely high vibrational resistance as regards their response to their own vibration frequency of $c/2a$ where c is the sonic speed in the crystal and a the side of the cube. To take the example of a bismuth germanate sensor with a side of 1 cm, this actual frequency is about 400 kHz and significantly adversely affects electric impact research.

The general and vague problem of "distortion" of the electric field to be measured has already been posed in the document by Tanaka JP-A-58 113 764. So as to resolve this problem, Tanaka recommends using as a sensitive Pockels effect element a parallelpiped-shaped component comprising, on two opposing sides perpendicular to the electric field to be measured, dielectric films whose dielectric constant has an intermediate value between that of the sensitive element and that the ambient environment allowing for a more progressive variation of the dielectric constant.

However, there are many causes of this "distortion" and the problem of "distortion" the invention seeks to resolve concerns the discrepancy between the directions of the electric field inside the crystal and the external field to be measured.

SUMMARY OF THE INVENTION

The object of the invention is to provide a Pockels effect electric field sensor making it possible to overcome the various drawbacks mentioned above. In particular, this sensor makes it possible to accurately measure the value of the electric field and accurately determine the orientation of this field. In addition, this sensor may measure an electric field from a wall and the probe portion of this sensor may be embodied with dimensions smaller than those of probes of the prior Art. Furthermore, the influence of the resonance frequencies of the crystal is significantly reduced.

More specifically, the object of the invention is to provide a Pockels effect electric field sensor comprising, as a sensitive element, a crystal with electro-optical properties traversed by a luminous beam with specific polarization and propagation directions, wherein the crystal is cut into the shape of an ellipsoid and exhibits a crystallographic symmetry, either uniaxial 622, 422 or 42 m or cubic 43 m or 23, the three perpendicular axes of the ellipsoid being orientated along three trirectangular crystallographic axes with the strongest symmetry of the crystal.

For example, in the case of a symmetry 622, the axes of the ellipsoid need to be parallel to the numbered axis 6 and to a pair of numbered axes 2 perpendicular to each other.

The use of a probe crystal cut according to the invention into the shape of an ellipsoid and in particular into the shape of a sphere makes it possible to eliminate the geometric distortions of the electric field to be measured produced by the crystal.

The originality of the invention resides in the simultaneous conjunction of the following two properties of the probe: macroscopic ellipsoid shape and the cubic or uniaxial crystallographic symmetry particular to the crystal. The first property makes it possible to ensure the constancy of the electric field in the probe and to biuniquely connect its value with that of the field existing prior to the introduction of the probe, and the second property makes it possible to biuniquely connect the measured electro-optical effects to the field existing in the probe.

The crystals applicable to the invention are those for which the electro-optical tensor (or Pockels tensor) has only three positive coefficients r41, r52 and r63 (the first index indicates the line of the tensor and the second indicates the column). For crystals having a cubic symmetry 43 m and 23, these three coefficients are equal, whereas they are different for the crystals having a uniaxial symmetry 622, 422 and 42 m. Thus, the optical response of the sensor for a crystal with cubic symmetry shall be identical for the three perpendicular components of the electric field, whereas it shall be different for a crystal having a uniaxial symmetry. In this latter case, it may be possible to calculate these components on the basis of a knowledge of the coefficients r41, r52 and r63 as determined by previous operations or by a prior sampling in a uniform electric field having a known direction and value.

When the monocrystal is cut into an ellipsoid shape whose axes are parallel to the main axes of the dielectric tensor (which constitute one mark in which this tensor is diagonalized), there is a single biunique relation between the external field $\vec{Ee}$ desired to be measured and the field inside the crystal $\vec{Ei}$. In fact, the dielectric tensor is diagonalized in the mark observing the strongest symmetries of the crystal.

Thus, it is possible to accurately measure the component of the electric field in a direction determined by the user, irrespective of the orientation of the electric field.

Thus, the sensor of the invention may be a monochannel sensor. In the case of an ellipsoidal probe, the monochannel version may only be obtained for certain orientations of the axes of the ellipsoid with respect to the crystallographic axes, which is not the case for a spherical sensor.

In addition, it is possible to modulate response in certain directions by acting on the depolarization coefficients, depending on whether the ellipsoid is given a more or less oblong shape.

The sensor of the invention advantageously includes three optical measuring channels making it possible to independently measure the three perpendicular components of the electric field. In particular, the portions of the measuring channels situated in the crystal are respectively orientated along the three trirectangular crystallographic axes with the strongest crystal symmetry.

It uses the same measuring principle as the one used in the prior art. This measurement is a purely optical measurement.

According to one particular embodiment of the sensor of the invention, each measuring channel includes a monochromatic light source emitting an incident beam, a device for polarizing the incident beam along a first crystallographic direction of the crystal, means for introducing the polarized incident beam into the crystal along a second crystallographic direction, a device for analyzing the luminous beam leaving the crystal, and an element for detecting the analyzed luminous beam. To this effect, the crystal comprises at least two pairs of flat parts parallel to the locations where said crystallographic axes emerge from the crystal.

Instead of using a light source and a detector for each measuring channel, it is subsequently possible to use a single source and a single detector for all the measuring channels. In this case, an optical switch needs to be respectively provided at the outlet of the luminous source and at the inlet of the detector.

Advantageously, each measuring channel includes a polarization retention input optical fiber for carrying the incident beam and a polarization retention outlet optical fiber for carrying the beam leaving the crystal.

This type of fiber makes it possible to place the polarization device directly at the outlet of the luminous source and the analysis device directly at the inlet of the detection element. This allows for a significant reduction of the probe portion of the sensor with respect to that of the prior art, which, according to the invention, is constituted solely by the crystal.

The use of polarization retention fibers makes it possible to distance the polarization and analysis means from the crystal and thus to reduce the disturbance of the lines of the electric field to be measured.

So as to be able to carry out measurements from a wall, the crystal functions on reflection. In particular, for each measuring channel, the incident beam entering the crystal and the beam leaving this crystal form a maximum angle of 5°.

The amplitude of the luminous wave borne by the optical outlet fiber varies linearly with the electric field to be measured. As a result, the luminous intensity detected by the detector varies quadratically with the electric field. Also, in order to carry out a linear detection, it is advantageously possible to insert a quarter-wave plate behind the inlet fiber so as to polarize the incident luminous beam circularly in front of its inlet in the crystal.

According to one improved embodiment of the electric field sensor of the invention, the polarization direction of the incident beam and the analysis direction of the beam leaving the crystal are parallel for each measuring channel.

The consequence of this configuration is to change the sign of the electric field response provided by the detector with respect to the case where the polarization and analysis directions are perpendicular.

On the other hand, this new configuration has highly significant consequences from the point of view of the practical embodiment of the sensor, in particular when this sensor functions on reflection.

In particular, owing to the common orientation of the polarization and analysis directions, it is possible to provide these polarization and analysis functions by using the same element for each measuring channel disposed at the inlet of the crystal. This polarization and analysis element may then be an extremely thin polaroid film and thus scarcely disturbing the electric field. Similarly, the phase shift is introduced between the polarized beam and the analyzed beam with a view to obtaining a linear response from the detector may be embodied, for each measuring channel, by means of a double passage provided in an eighth-wave plate disposed opposite the single polarization and analysis element.

Thus, it is possible to use the same optical fiber for each measuring channel alternately ensuring the carrying of the incident beam and the carrying of the beam leaving the crystal.

In addition, for each measuring channel, a single focussing lens disposed opposite the polarization and analysis element with an axis perpendicular to the flat parts of the crystal may alternately ensure collimation of the incident beam derived from the fiber and then the focussing of the beam leaving the crystal in this same fiber.

The use of a single lens used respectively for collimation of the incident beam and focussing of the beam leaving the crystal instead of using two separate lenses for collimation and focussing enables the diameter of the flat parts to be reduced. This makes it possible to retain the maximum of the spherical or ellipsoid sections, this extending in the symmetry maximum direction.

In addition, as polarization and analysis is effected close to the probe crystal, it is possible to use, instead of the polarization retention monomode fibers for each measuring channel, a multimode fiber (for example with an outer diameter of 125 micrometers and a core of 50 micrometers) so as to render coupling problems much less critical (the core of a polarization retention monomode fiber has dimensions of about 7 micrometers). This advantage is procured independent of the functioning type of the sensor (transmission or reflection) contrary to the case with the use of a given optical fiber, a single lens, a single eighth-wave plate and a given element for polarization and analysis, this advantage being linked to the fact that the crystal functions on reflection.

Accordingly, this sensor configuration is much simpler than the one described earlier.

BRIEF DESCRIPTION OF THE DRAWINGS

Other advantages and characteristics of the invention shall appear more readily from a reading of the following description, given by way of illustration and being in no way restrictive, with reference to the accompanying drawings in which.

DETAILED DESCRIPTION OF THE PREFERRED EMBODIMENTS

Figure 1:
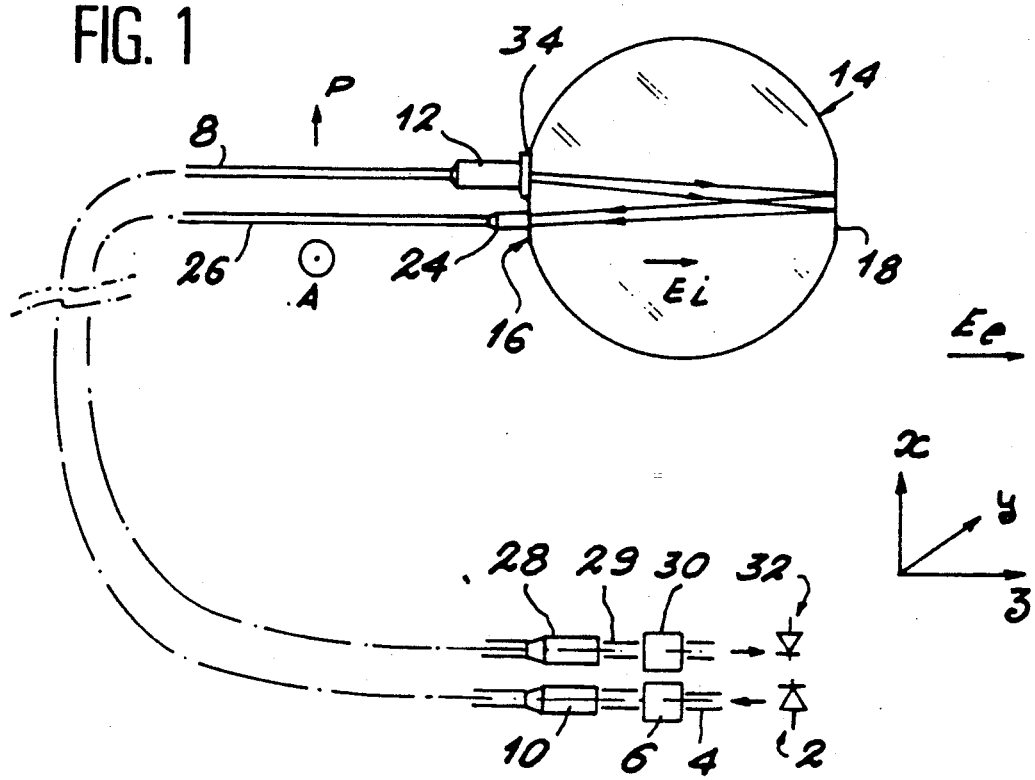
FIG. 1 is a skeleton diagram of a sensor conforming to the invention, this sensor only comprising a single measuring channel.

The skeleton diagram of the sensor of the invention represented on FIG. 1 shows a single measuring channel of the sensor for measuring a single component of an electric field. For a three-channel sensor, these channels are similar.

Each measuring channel comprises a luminous source 2 constituted by a monomode laser diode emitting a monochromatic luminous beam 4. This beam 4 is polarized rectilinearly along a first direction x or y by a polarizer 6 and then focussed in a polarization retention monomode inlet fiber 8 by a self-focussing type focussing lens 10 with a pitch of 0.25. The polarization axis of the fiber 8 is oriented along the first direction.

A self-focussing type collimation lens 12 with a pitch of 0.25 is placed at the outlet of the optical fiber 8 and is used to collimate the polarized incident beam prior to its input into the probe crystal 14 via a first flat part 16. The collimated incident beam entering the probe crystal bears the reference 17.

According to the invention, the probe crystal is an electro-optical monocrystal with uniaxial symmetry 622, 422 or $\bar{4}2$ m or with cubic symmetry $\bar{4}3$ m (such as $Bi_4 Ge_3 O_{12}$) or 23 cut in the shape of an ellipsoid or sphere.

The incident beam 17, which penetrates the crystal 14 via the flat part 16, is then reflected onto a second flat part 18 of the crystal so as to come out via the flat part 16. The flat parts 16 and 18 are diametrically opposite and constitute a pair of flat parts. They are polished according to an optical quality and disposed at the location where one of the three trirectangular crystallographic axes (100), (010) or (001) of the crystal emerges from the sphere 14.

According to the invention, injection of the incident beam 17 into the crystal is effected along a second direction z perpendicular to the first polarization direction x or y. In addition, the incident beam 17 entering via the flat part 16 into the probe crystal and the beam 20 leaving the crystal via this flat part 16 collectively form a maximum angle equal to 5°.

The beam 20 leaving the crystal 14 is focussed with the aid of a focussing lens 24, also a self-focussing type lens with a "pitch" of 0.25, in a second polarization retention fiber 26 parallel to the inlet fiber 8 and situated on the same side of the probe crystal 14. In addition, the polarization axis of the outlet fiber is perpendicular to that of the inlet fiber 8 and perpendicular to the propagation direction of the luminous beam; if the first direction is the direction x, the polarization axis of the fiber 26 is orientated along the direction y, and if the first direction is the direction y, the polarization axis of the fiber 26 is orientated along the direction x.

According to the invention, the directions x, y and z are parallel to three trirectangular axes with the strongest symmetry of the crystal.

At the outlet of the fiber 26, another self-focussing lens type collimation lens 28 is provided. The collimated measuring beam 29 is then received by an analyzer 30 crossed at 90° with respect to the polarizer 6 and then detected by a photodiode type detector 32.

In practice, the lenses 10 and 12 are glued to the two extremities of the fiber 8 and the lenses 24 and 28 are glued to the two extremities of the fiber 26. In addition, the lenses 12 and 24 are directly glued onto the sphere 14 opposite the flat part 16.

The functioning principle of the sensor is the measurement of the ellipticity induced in the crystal by the electric field to be measured. This measurement is carried out by comparing the phase difference between the polarizations of the incident beam 17 and the measuring beam 20. It only has any significance if this phase measurement is possible for the entire section of the beams (since the detector measures the total power of these beams). This implies, apart from other factors, that the luminous path is the same for all the luminous lines, that is that the beams extend as a plane wave inside the crystal. Even if the luminous path is the same for all the lines outside the crystal, the condition for plane wave propagation inside the crystal is unable to be satisfied, having regard to the finished transverse dimension of the beams, only if the diopter 16 via which the incident beam penetrates is plane.

In fact, if the inlet face of the crystal is not plane, there is no reason for parallel luminous beams in front of the crystal to come out parallel on account of the two refractions at the inlet and the outlet of the crystal.

Figure 2:
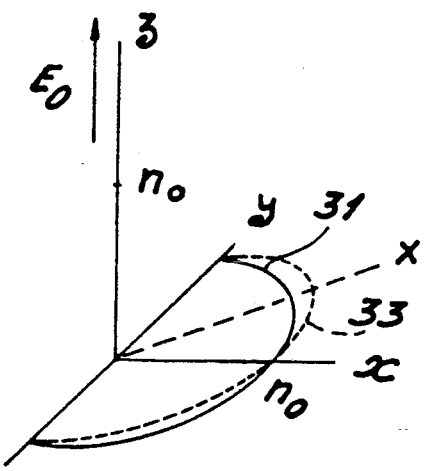
FIGS. 2a and 2b illustrate the functioning principle of a sensor conforming to the invention.
Figure 2:
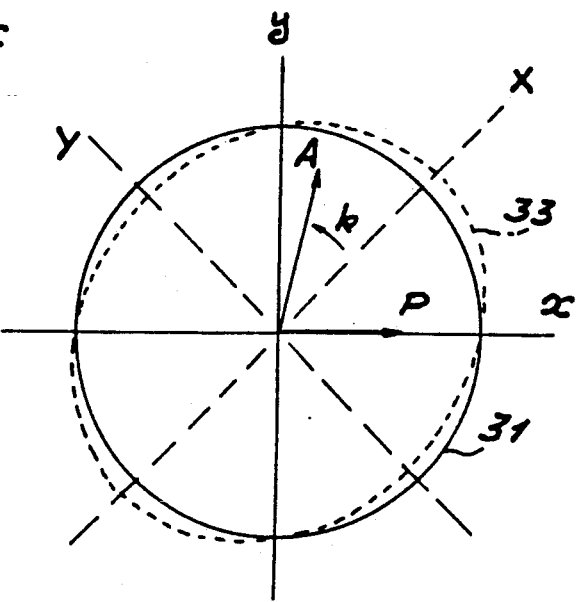

FIGS. 2a and 2b illustrate the functioning principle of the sensor of the invention.

In a crystal with cubic symmetry subjected to an electric field $\vec{Ee}$ parallel to a numbered axis 4 of the crystal, such as the crystallographic direction (001) or the direction z (FIG. 2a), the sphere of the indices 31 becomes an ellipsoid 33 whose main axes are the axes ($\bar{1}10$), (110) and (001) respectively marked X, Y and Z (FIG. 2b).

FIG. 2a shows the ellipticity created in the plane xy in the presence of a field $\vec{Ee}$ along z and FIG. 2b is a section of the ellipsoid of the indices 33 within the plane xy.

The electric field of the incident polarized beam remains inside the plane XY and is only sensitive to the index variations induced in this plane by the continuous field $\vec{Ei}$ existing inside the crystal according to the equations $dn_x = r.no^3.\vec{Ei}/2$ and $dn_y = r.no^3.\vec{Ei}/2$ with r representing the electro-optical coefficient (about several pm/V) and no is the index of the crystal in the absence of any electric field (that is, the line of the sphere 31). The ellipticity created is thus directly proportional to the value of the field Ee.

When the incident beam 17 extends along the direction (001) or z and is polarized parallel to the direction (100) or x, the beam emerging from the probe crystal comes out again with an elliptical polarization in the plane xy perpendicular to the propagation direction z since the axes XY of the ellipsoid of the indices 33 are the bisecting lines of the angle xy. This elliptical polarization is easily detected by the analyzer 30 orientated perpendicular to the propagation and polarization directions of the incident beam 17, that is along the direction (010) or y.

So as to carry out a linear detection along a direction x or y, it is possible to insert a quarter-wave plate 34 at the outlet of the inlet fiber 8 between the collimation lens 12 and the crystal 14 so as to circularly polarize the incident beam 17 inside the plane xy.

When the probe crystal is subjected to an electric field $\vec{Ee}$ parallel to the direction (100) or (010), which corresponds to a rotation of 90° with respect to the preceding case, the emerging beam 20 remains polarized inside the plane xz and defined by the incident wave vector and the polarizer, this plane being a principal plane of the crystal. As this plane xz is perpendicular to the plane yz, which is the other principal plane of the crystal of the analyzer, no signal is detected.

Thus, the sensor of the invention makes it possible to measure, not merely the value of the electric field, but also its direction.

In fact, contrary to the case of a probe crystal of any shape, the use of a spherical-shaped crystal makes it possible to biuniquely connect the field $\vec{Ei}$ inside the spherical crystal to the external electric field $\vec{Ee}$ to be measured which existed prior to the introduction of the probe:

$$Ei = \frac{3\epsilon_e}{2\epsilon_e + \epsilon_i} Ee \quad (1)$$

In this expression, (1), $E_e$ is the relative dielectric constant of the ambient environment, generally close to the unit (case of air) and $E_i$ is the dielectric constant of the probe crystal. Thus, the field $\vec{Ei}$ in the crystal is directly connected by a single proportionality factor to the field Ee to be measured.

The reflection of the incident beam 17 onto the flat part 18 is possible as the refraction index of the mineral electro-optical crystals is relatively high (2 in the case of $Bi_4 Ge_3 O_{12}$).

In addition, the loss of luminous intensity due to the reflection factor of less than 1 is partially compensated by the doubling of ellipticity due to doubling of the optical path in the probe crystal.

In a crystal cut according to the shape of an ellipsoid having axes with the dimensions a, b and c along the trirectangular directions X, Y and Z, the external electric field Ei and the induction Di existing in the crystal are connected to the electric field Ee to be measured, which existed prior to introduction of the sensor, by means of the equation (2):

$$(1 - n^{(L)}) \epsilon E^{i(L)} + n^{(L)} D^{i(L)} = \epsilon E^{e(L)} \quad (2)$$

with l = X, Y or Z and $$n^{(L)} = \frac{abc}{2} \frac{ds}{(s+a)Ro}$$

with a = a, b or c and where $$Ro = \sqrt{(s+a^2)(s+b^2)(s+c^2)}$$

$n^{(l)}$ are depolarization coefficients and are numbers which depend on the shape of the ellipsoid. As $\overline{Di}$ is connected linearly to $\overline{Ei}$ by the dielectric tensor of the ellipsoid (not strictly diagonal along the axes of the ellipsoid), this results from (2) that the field is constant in the ellipsoid. If in addition the axes of the ellipsoid are parallel to the main axes of the dielectric tensor, it is possible to replace in (2) Di $^{(l)}$ by Ei $^{(l)}$ Ei, $^{(l)}$ which enables the field to be rendered positive inside the ellipsoid according to the following equation (3):

$$Ei = \frac{\epsilon_o Ee\,(1)}{\epsilon_o + (\epsilon_i^{(1)} - \epsilon_o) n^{(1)}}$$

an expression which is reduced to (1) in the case of a sphere as $n^{(l)} = \frac{1}{3}$.

The skeleton diagram of FIG. 1 shows a single optical measuring channel.

Figure 3:
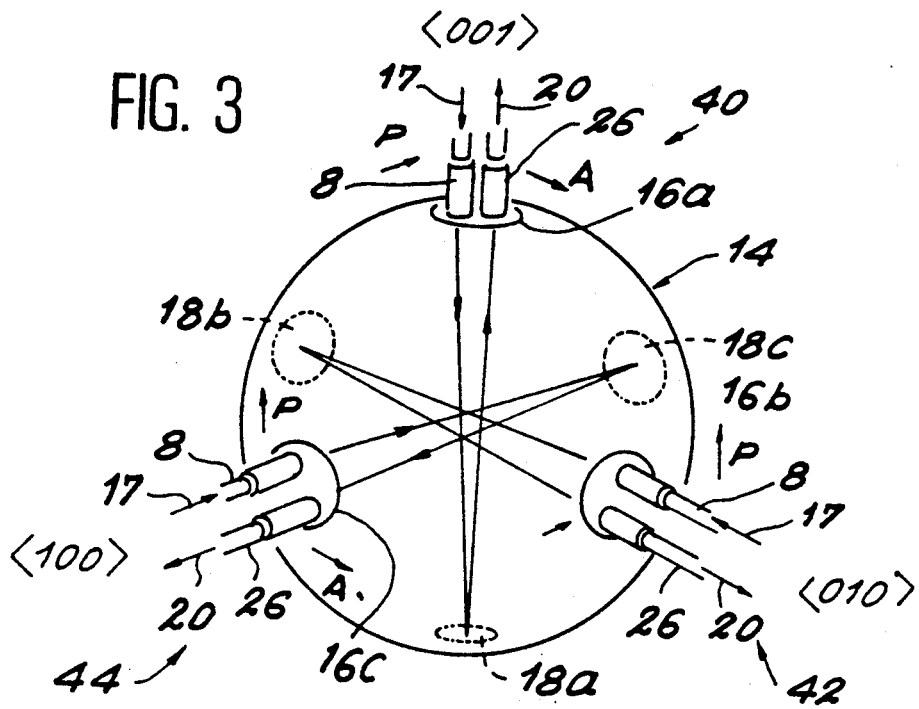
FIG. 3 shows an embodiment of a sensor conforming to the invention with three measuring channels in which the probe crystal comprises three pairs of flat parts, FIG. 4 diagrammatically represents another embodiment of a sensor conforming to the invention, this sensor having three measuring channels and in which the probe crystal comprises two pairs of flat parts, FIG. 5 completes FIG. 4.

FIG. 3 shows an example of the embodiment of the sensor of the invention and comprising three optical channels, respectively 40, 42 and 44, in the probe crystal 14. Each measuring channel is only sensitive to the component of the electric field parallel to propagation of the incident luminous beam 17 (or emerging from the sensor 20).

In particular, the measuring channel 40 is sensitive to the component (001) of the electric field, the measuring channel 42 is sensitive to the component of the electric field along the direction (010) and the optical channel 44 is sensitive to the component of the electric field orientated along the direction (100).

In this embodiment, the probe crystal 14 comprises three pairs of optically polished flat parts, respectively 16a–18a, 16b–18b and 16c–18c, the flat parts 18a, 18b and 18c being diametrically opposite the flat parts 16a, 16b and 16c. The pairs of flat parts 16a–18a, 16b–18b and 16c–18c are disposed respectively at the locations where the crystallographic axes (001), (010) and (100) emerge from the crystal. The flat parts 16a, 16b and 16c are used at the inlet and outlet of the incident beams and disturbed by the crystal; the flat parts 18a, 18b and 18c ensure reflection of the incident beams in the crystal.

FIG. 3 shows the polarization P and analysis A directions of the incident 17 and emerging 20 beams corresponding to the orientation of the polarization axes of the inlet and outlet fibers and thus to that of the component of the electric field to be detected.

For the measuring channel 40, the polarizer is orientated along the direction (100); for the measuring channel 42, the polarizer is orientated along the direction (001) and the analyzer along a direction (100); for the measuring channel 44, the polarizer is orientated along the direction (001) and the analyzer along a direction (010). In fact, for one measuring channel, the polarization and analysis directions may be permuted.

Figure 4:
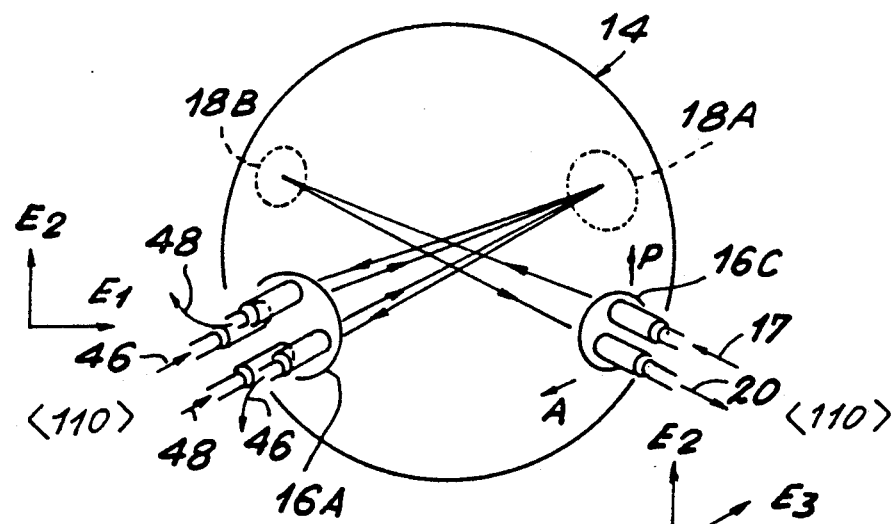

On FIG. 4, the sensor shown only comprises two pairs of flat parts, respectively 16A–18A and 16–18B diametrically opposing and respectively orientated along the crystallographic planes (110) and $(\bar{1}10)$ of the probe crystal, but still comprise three optical measuring channels, respectively 46, 48 and 50 whose sections located inside the crystal are orientated along the trirectangular crystallographic axes of the crystal. These three channels 46, 48 and 50 are used to independently measure the three components, respectively E1, E2 and E3, of the electric field.

Figure 5:
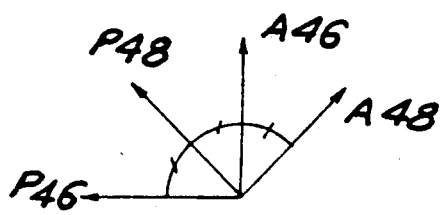

In this embodiment, the propagation direction $(\bar{1}10)$ of the incident 17 and emerging 20 beams is used to measure the components E1 and E2 of the electric field parallel to the directions (110) and (001). To this effect, two pairs of polarizers and analyzers P46–A46 and P48–A48 are used orientated at 45° with respect to one another for the measuring channels 46 and 48, which are parallel. In other words, the polarizers P46 and P48 collectively form an angle of 45° and the analyzers A46 and A48 collectively form an angle of 45°, the polarizer P46 and the analyzer A46 being crossed at 90° and the polarizer P48 and the analyzer A48 being also crossed at 90°. This configuration is shown on FIG. 5 in the plane of the flat part 16 (crystallographic plane $(\bar{1}10)$).

The third component E3 of the electric field orientated along the direction $(\bar{1}10)$ is measured by making the incident beam extend along the direction (110) via the measuring channel 50.

The advantage of this embodiment is of placing as many as possible of the optical fibers on a given side of the probe so as to easily take measurements in locations with difficult access. In particular, the measuring channels 46 and 48 are parallel.

In the embodiments shown on FIGS. 3 and 4, for the purpose of simplification, these figures only show the probe portion of the sensor. For this same reason, the quarter-wave plate 34 has been omitted at the outlet of the inlet fibers.

In the configuration of the sensor described above, the crystal was placed for each measuring channel between an analyzer A and a polarizer P crossed at 90° and orientated 45° from the main axes of the ellipsoid of the indices 33. The respective positions of the polarizer P and the analyzer A are shown on FIG. 2b. The unitary vectors are marked $\overline{X}$ and $\overline{Y}$ along the axes X and Y.

The polarizer P was orientated along a direction $(\overline{X}-\overline{Y})/\sqrt{2}$ and the analyzer A was perpendicular to the polarizer P and thus orientated along the direction $(\overline{X}+\overline{Y})/\sqrt{2}$. Between the analyzer and the polarizer of each measuring channel, the quarter-wave plate 34 has been inserted whose neutral lines are 45° from the polarization axes of the polarizer and the analyzer and thus parallel to the axes of the ellipsoid. Thus, this plate induces a phase shift of $\pi/2$ between the components parallel to X and Y.

It is now assumed that the analyzer A is no longer orientated perpendicular to the polarizer and the angle between the analyzer A and the main axis X of the ellipsoid of the indices 33 is marked k.

It is then possible to calculate the expression of the amplitude of the luminous beam at various locations of a measuring channel by making neither the phase factor common to the two components of the beam appear along X and X' nor the transmission coefficients common to these two components at the crossing point of the various optical elements and in particular of the polarizer, the analyzer, the probe crystal and the quarter-wave plate.

Behind the polarizer, the amplitude of the electromagnetic field is:

$$Em1 = \frac{Ew}{\sqrt{2}} (\overline{X} - \overline{Y})$$

E representing the amplitude of the initial electromagnetic field and w its pulsation.

Under the effect of the external electric field $\overrightarrow{Ei}$ to be measured, the probe crystal acquires an induced double refraction which creates a phase lead $\phi$ of the component of the electromagnetic field parallel to $\overline{X}$ and a phase delay $-\phi$ of the component of the electromagnetic field parallel to $\overline{Y}$ of $(\pi/\lambda) r.no^3.\overrightarrow{Ei}$.

After crossing of the crystal, the amplitude of the electromagnetic field Em2 is thus:

$$Em2 = \frac{Ew}{\sqrt{2}} (e^{i\phi} \overline{X} - e^{i\phi} \overline{Y})$$

After the crossing of the quarter-wave plate, the component parallel to $\overline{X}$ shifts by $\pi/2$ with respect to the one parallel to $\overline{Y}$ and the amplitude of the field Em3 is then:

$$Em3 = \frac{Ew}{\sqrt{2}} (e^{i(\phi+\pi/2)}\overline{X} - e^{i\phi}\overline{Y}) \quad (4)$$

In the previous expression (4), it shall be observed that $\pi/2$ switches with $\phi$; in other words, the quarter-wave plate may be positioned either in front of or behind the probe crystal or may even by divided into two eighth-wave plates, one being placed in front of the crystal and the other behind the crystal.

The amplitude of the electromagnetic field Em4 behind the analyzer is equal to the scalar product P.Em3 where P represents the polarization vector, namely:

$$Em4 = \frac{Ew}{\sqrt{2}} [(e^{i(\phi+\pi/2)} \cos k)\overline{X} - (e^{-i\phi} \sin k)\overline{Y}]$$

The square of its module $|Em4|^2$ is proportional to the intensity transmitted behind the polarizer marked It, $|Ew|^2$ being proportional to the incident intensity Ii with the same proportionality coefficient. Thus, the following is deduced:

$$It = \frac{Ii}{2}(1 + \sin 2k \sin\phi) \quad (5)$$

This last expression (5) shows that in the module, the relative intensity variation transmitted with $\phi$, that is with the electric field $\vec{Ee}$ to be measured, is maximum for $k = (\pi/4) = m(\pi/2)$ where m is a whole number, these angles corresponding to an orientation of the analyzer parallel or perpendicular to the polarizer, sin2k taking the value 1 or −1 depending on the case.

Figure 6:
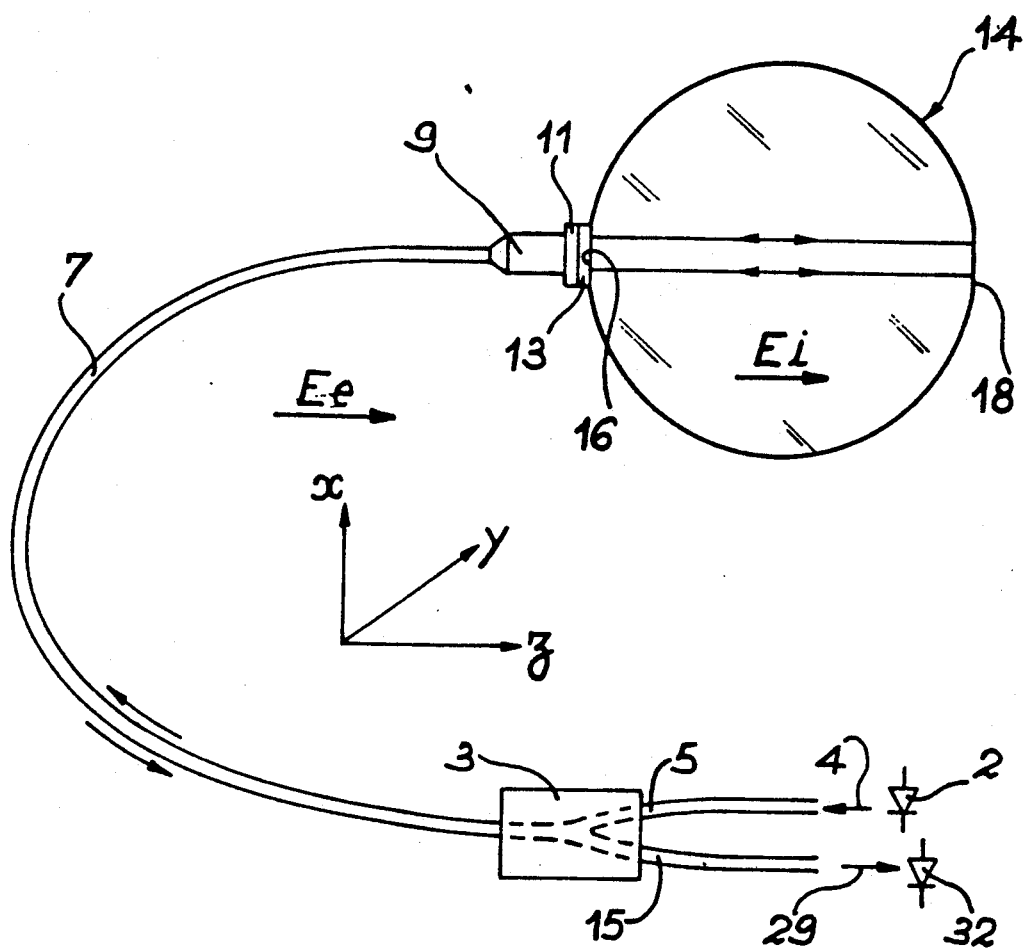
FIG. 6 shows another embodiment of a sensor conforming to the invention, wherein the polarization and analysis directions of the luminous beam are parallel.

In the embodiment of the sensor of the invention and shown on FIG. 6, the polarization and analysis axes for each measuring channel are parallel, which corresponds to sin2k = −1 in the equation (5).

FIG. 6 only shows a single measuring channel of the sensor and intended to only measure a single component of an electric field $\vec{Ee}$. The other two measuring channels of the sensor are identical to the one represented. In addition, the sensor is shown functioning on reflection.

Each measuring channel comprises a luminous source 2 constituted by a monomode or multimode laser diode emitting a monochromatic luminous beam 4 intended to be carried by a silica multimode optical fiber 7 with a core diameter of 50 μm and an external diameter of 125 μm. At a first extremity, this optical fiber 7 is equipped with a bidirectional coupler 3 comprising a branching 5 placed opposite the laser diode 2 so as to recover the incident beam 4.

In accordance with the invention, the multimode optical fiber also is used to carry the luminous beam emerging from the probe crystal 14 which is an ellipsoid with axes xyz or more particularly a $Bi_4Ge_3O_{12}$ sphere. To this effect, the bidirectional coupler 3 comprises a branching 15 placed opposite the photodiode type detector 32 used to direct the analyzed measuring beam 29 onto the detector 32.

The extremity of the optical fiber 7 opposite the one equipped with the bidirectional coupler 3 is provided with a self-focussing type lens 9 with a pitch or fractional pitch of 0.25 used alternately to collimate the incident beam 4 in front of its inlet in the probe crystal 14 via the first flat part 16 of the crystal and then to focus the luminous beam emerging from the probe crystal 14, still via the flat part 16, in the multimode optical fiber 7.

In accordance with the invention, the polarization of the incident beam and the analysis of the beam emerging from the probe crystal 14 are ensured by a given element 11 constituted by a polarizing film glued to the face of the lens 9 opposite the one mounted at the end of the fiber. This polarizing film 11 may be a polaroid type sheet with a thickness of about 0.5 mm.

The linearization of the outlet signal is obtained by means of a single eighth-wave plate 13 inserted between the polarizing film 11 and the probe sphere 14. This plate 13 may be kept opposite the flat part 16 by glueing its periphery to the flat part.

In accordance with the invention, the incident beam 4 borne by the optical fiber 7 is first of all collimated by the lens 9 and polarized by the polarizing film 11 along the direction x or y perpendicular to the propagation direction z of the crystal of the electric field $\vec{Ee}$ to be measured.

After a first passage through the eighth-wave plate 13, the collimated and polarized beam penetrates into the probe crystal 14 via the flat part 16 so as to be reflected onto the diametrical opposing flat part 18 and then come out via the flat part 16. The beam emerging from the crystal 14 in turn traverses the plate 13, then the polarizing element 11 then used as an analyzer so as to be focussed by the lens 9 in the optical fiber 7 and be directed by the coupler 3 onto the photodiode 32 in order to be detected.

The sensor shown on FIG. 6 may be a sensor with three pairs of flat parts or even a sensor with two pairs of flat parts, as described earlier.

It ought to be mentioned that the parallelism of the polarization direction of the incident beam and the analysis direction of the beam emerging from the crystal is, for an optical channel for measuring the electric field via the Pockels effect, not merely restricted to a crystal cut into the shape of an ellipsoid and in particular into a sphere. This characteristic is applicable to any crystal having two opposing faces, and especially two plane faces, parallel to the inlet and outlet points of the luminous beam. This characteristic is much more advantageous when an original disposition is used, namely functioning on reflection, since it makes it possible to use a single fiber to guide the incident beam and the outgoing beam.

What is claimed is:

1. Pockels effect electric field sensor comprising, as a sensitive element, a crystal with electro-optical properties and traversed by a luminous beam with specific polarization and propagation directions, wherein the crystal is cut into the shape of an ellipsoid and has a crystallographic symmetry selected from the group consisting of uniaxial symmetry 622, 422 and $\overline{4}2$ m and cubic symmetry $\overline{4}3$ m and 23, the three perpendicular axes of the ellipsoid being orientated along three trirectangular crystallographic axes with the strongest symmetry of the crystal.

2. Sensor according to claim 1, wherein the crystal is cut into the shape of a sphere.

3. Sensor according to claim 1, and having at least one measuring channel comprising a monochromatic light source emitting an incident beam, polarizing means for polarizing the incident beam along a first crystallographic axis of the crystal, introducing means for introducing the polarized incident beam into the crystal along a second crystallographic axis, analyzing means for analyzing the luminous beam emerging from the crystal, and detecting means for detecting the analyzed luminous signal.

4. Sensor according to claim 3, wherein the polarizing means for each measuring channel is located directly at the outlet of the luminous beam, the analyzing means is located directly at the inlet of the detection means, and wherein each measuring channel additionally comprises a polarization retention inlet optical fiber for carrying the incident beam, and a polarization retention outlet optical fiber for carrying the beam emerging from the crystal.

5. Sensor according to claim 4, wherein each measuring channel additionally comprises a first focusing lens disposed at the outlet of the polarizing means for focusing the incident beam in the inlet fiber, a first collimation lens disposed at the outlet of the inlet fiber for collimating the incident beam entering into the crystal, a second focusing lens placed at the outlet of the crystal for focusing the beam emerging from the crystal in the outlet fiber, and a second collimation lens placed at the outlet of the outlet fiber for collimating the beam emerging from the crystal on the analyzing means.

6. Sensor according to claim 5, wherein the first collimation lens and the second focussing lens are disposed on the same side of the crystal.

7. Sensor according to claim 3, wherein for each measuring channel, the incident beam entering into the crystal and the beam emerging from the crystal form an angle of at the most 5°.

8. Sensor according to claim 4, wherein said sensor includes two measuring channels, wherein the optical inlet and outlet fibers of two measuring channels are disposed on the same side of the crystal.

9. Sensor according to claim 3, wherein the polarization direction of the incident beam and the analysis direction of the beam emerging from the crystal for each measuring channel are parallel.

10. Sensor according to claim 9, wherein the crystal functions on reflection, the means for polarizing the incident beam and the means for analyzing the beam emerging from the crystal consist of one and the same element disposed at the inlet of the crystal and wherein each measuring channel includes an optical fiber alternately ensuring carrying of the incident beam and carrying of the beam emerging from the crystal.

11. Sensor according to claim 10, wherein each optical fiber comprises a bidirectional optical coupler at one of its extremities comprising a first branching intended to receive the incident light beam emitted by the source and a second branching intended to direct the beam emerging from the crystal onto the detector.

12. Sensor according to claim 10, wherein each measuring channel further comprises a lens disposed opposite said same element alternately ensuring collimation of the incident beam on the crystal and focusing of the measuring beam emerging from the crystal in the optical fiber.

13. Sensor according to claim 10, wherein each measuring channel further comprises an eighth-wave plate disposed opposite said same element.

14. Sensor according to claim 1, wherein the sensor is disposed to function on reflection.

15. Sensor according to claim 10 wherein said same element is constituted by a thin polaroid type film.

16. Sensor according to claim 1, and having three optical measuring channels for independently measuring the three perpendicular components of the electric field, wherein the three measuring channels located in the crystal are orientated along the three trirectangular crystallographic axes with the strongest symmetry of the crystal.

17. Sensor according to claim 1, wherein the crystal comprises at least two pairs of flat parts diametrically opposing each other parallel to the locations where the crystallographic axes emerge from the crystal.

18. Sensor according to claim 1, wherein the crystal has a symmetry of 43 m and in particular is a $Bi_4Ge_3O_{12}$ crystal.

19. Sensor according to claim 13, wherein the eighth-wave plate is inserted between said same element and the crystal.

* * * * *